United States Patent
Takeda

(10) Patent No.: US 12,119,419 B2
(45) Date of Patent: Oct. 15, 2024

(54) PHOTODETECTOR

(71) Applicant: Nippon Telegraph and Telephone Corporation, Tokyo (JP)

(72) Inventor: Kotaro Takeda, Musashino (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 609 days.

(21) Appl. No.: 17/422,037

(22) PCT Filed: Jan. 15, 2020

(86) PCT No.: PCT/JP2020/000955
§ 371 (c)(1),
(2) Date: Jul. 9, 2021

(87) PCT Pub. No.: WO2020/149277
PCT Pub. Date: Jul. 23, 2020

(65) Prior Publication Data
US 2022/0102561 A1    Mar. 31, 2022

(30) Foreign Application Priority Data

Jan. 16, 2019  (JP) ................................ 2019-005496

(51) Int. Cl.
*H01L 31/024* (2014.01)
*H01L 27/146* (2006.01)
*H01L 31/028* (2006.01)

(52) U.S. Cl.
CPC ...... *H01L 31/024* (2013.01); *H01L 27/14643* (2013.01); *H01L 31/028* (2013.01)

(58) Field of Classification Search
CPC ............. H01L 31/024; H01L 27/14643; H01L 31/028; H01L 31/10
See application file for complete search history.

(56) References Cited

U.S. PATENT DOCUMENTS

| 2006/0198416 A1 | 9/2006 | Yamazaki |
| 2009/0110014 A1* | 4/2009 | Miller ................. H01S 5/02325 257/E33.001 |
| 2021/0217785 A1* | 7/2021 | Takeda .................. H01L 31/028 |

FOREIGN PATENT DOCUMENTS

| JP | 2002156536 A | * | 5/2002 |
| JP | 2006-245344 A | | 9/2006 |
| JP | 2015-153899 A | | 8/2015 |
| JP | 2018-74104 A | | 5/2018 |
| JP | 2018-82089 A | | 5/2018 |

(Continued)

OTHER PUBLICATIONS

G. G. Macfarlane et al., *Fine Structure in the Absorption-Edge Spectrum of Ge*, Physical Review, vol. 108, No. 6, 1957, pp. 1377-1383.

*Primary Examiner* — Benjamin P Sandvik
(74) *Attorney, Agent, or Firm* — Workman Nydegger

(57) ABSTRACT

A photodetector having a sufficient ESD withstand voltage is provided. An embodiment of a photodetector includes a plurality of photodiodes including germanium or a germanium compound in a light absorption layer, and a plurality of heaters configured to apply heat to the light absorption layer of each of the plurality of photodiodes, in which the plurality of heaters are connected in series, the plurality of heaters are connected in parallel, or a plurality of sets of the plurality of heaters serially connected are connected in parallel.

14 Claims, 17 Drawing Sheets

(56) References Cited

FOREIGN PATENT DOCUMENTS

JP  2018074104 A  *  5/2018
JP  2018082089 A  *  5/2018

* cited by examiner

PHOTODETECTOR

TECHNICAL FIELD

The present invention relates to a photodetector, and more particularly to a photodetector that is used in an optical communication system, an optical information processing system, or the like and has a small common-mode rejection ratio when a differential signal is received.

BACKGROUND ART

With the spread of optical communication in recent years, there is a demand for cost reduction of optical communication devices. As one solution thereto, a method of forming an optical circuit constituting an optical communication device on a silicon wafer having a large diameter using a micro optical circuit technique based on silicon photonics is known. Thus, a material cost per chip can be dramatically reduced, and a cost of the optical communication device can be reduced. A photodetector formed on a silicon (Si) substrate using such a technique includes a germanium photodetector (GePD) capable of monolithic integration.

FIG. 1 illustrates a structure of a waveguide-coupled vertical GePD of the related art. FIG. 2 is a cross-sectional view taken along a reference sign II-II of FIG. 1. A vertical GePD 100 is formed on a silicon on insulator (SOI) substrate including a Si substrate, a Si oxide film, and a surface Si layer using a lithography technique or the like. The vertical GePD 100 includes a Si substrate 101, a lower clad layer 102 formed of a Si oxide film on the Si substrate, a core layer 110 that guides signal light, a Ge layer 114 that absorbs light formed on the core layer 110, and an upper clad layer 103 formed on the core layer 110 and the Ge layer 114. The core layer 110 is divided into a waveguide layer 141 and a silicon slab 142.

In the silicon slab 142, a p-type Si slab 111 doped with impurity ions having a first conductivity type and silicon electrode portions 112 and 113 doped with the impurity ions having the first conductivity type at a high concentration and acting as electrodes are formed. The Ge layer 114 is stacked by epitaxial growth, and a Ge region 115 doped with impurity ions having a second conductivity type is formed on the Ge layer 114. The Ge layer 114 may be a germanium compound. Electrodes 116 to 118 are included on the silicon electrode portions 112 and 113 and the Ge region 115, respectively, to come into contact with the silicon electrode portions 112 and 113 and the Ge region 115.

In order to make a structure easy to understand, the clad layer 103 is omitted and only positions at which the electrodes 116 to 118 come into contact with the silicon electrode portions 112 and 113 and the Ge region 115 are shown in FIG. 1.

In the vertical GePD 100, when light is incident on the silicon slab 142 from the waveguide layer 141 and is absorbed by the Ge layer 114, a photocurrent flows between an electrode 117 and the electrodes 116 and 118. The light is detected by detecting this photocurrent.

FIG. 3 illustrates a first example of a waveguide-coupled horizontal GePD of the related art. A horizontal GePD 100 includes a germanium region 121 doped with impurity ions having a first conductivity type and a germanium region 122 doped with impurity ions having a second conductivity type, instead of the p-type Si slab 111 and the Ge region 115 illustrated in FIG. 2.

FIG. 4 illustrates a second example of a waveguide-coupled horizontal GePD of the related art. A horizontal GePD 100 includes a silicon region 131 doped with impurity ions having a first conductivity type, a silicon region 132 doped with impurity ions having a second conductivity type, and a silicon electrode portion 133 doped with second impurities at a high concentration and acting as an electrode, instead of the p-type Si slab 111 and the Ge region 115 illustrated in FIG. 2.

FIG. 5 illustrates an example of a configuration of a receiver that is used in an optical digital coherent communication technology. The receiver is a dual-polarization multiplex quadrature phase shift keying (DP-QPSK) receiver, and received light is separated into two orthogonal polarized waves by a polarized wave separator 11. In optical hybrids 13a and 13b, the two polarized waves are caused to interfere with local light from a local light emitting source 12, intensity and phase information is detected, and two sets of differential signals are converted to electrical signals by four GePDs 14 and 15. In such a receiver, when temperature control is performed, it is necessary for a heater to be included in each of the GePDs 14 and 15. In particular, because the GePDs connected to the same optical hybrid receive differential signals in pairs, the paired GePDs are required to have uniform sensitivity.

CITATION LIST

Patent Literature

[Patent Literature 1] JP 2015-153899 A
[Patent Literature 2] JP 2006-245344 A
[Patent Literature 3] JP 2018-074104 A

Non Patent Literature

Non Patent Literature 1: Macfarlane G. G., T. P. McLean, J. E. Quarrington and V. Roberts, "fine Structure in the Absorption-Edge Spectrum of Ge," Physical Review vol. 108, No. 6 (1957) p. 1377-1383.

SUMMARY OF THE INVENTION

Technical Problem

FIG. 6 illustrates temperature and wavelength dependent characteristics of sensitivity of a GePD of the related art. The GePD of the related art has characteristics that temperature characteristics of sensitivity are not constant. Here, the sensitivity is a characteristic of a current output with respect to optical input power, and has units of A/W. FIG. 6 is a diagram obtained by plotting sensitivity to temperature in a C band and an L band (wavelengths 1530 to 1565 nm and 1565 to 1625 nm, respectively) of a communication wavelength band when a reverse bias of 1.6 V is applied to a GePD. For example, the sensitivity at 31° C. is substantially constant up to the vicinity of the C band, but the sensitivity decreases in the L band. This change in sensitivity is caused by a change in a light absorption spectrum of germanium. At −5° C., the sensitivity tends to decrease even in the C band.

FIG. 7 illustrates temperature dependent characteristics of the light absorption spectrum of Ge. A horizontal axis indicates photon energy, and a vertical axis indicates a square root of an absorption coefficient (see, for example, Non Patent Literature 1). When a temperature becomes low, a bandgap of the germanium shifts to the high energy side. That is, an edge of the light absorption spectrum shifts to a short wavelength side. The edge of the light absorption spectrum of germanium that is used for a GePD is just about 1565 nm on the long wavelength side of the C band at 31° C. Therefore, even when a GePD shows constant sensitivity over the entire C band at 31° C., the sensitivity gradually decreases from the long wavelength side as the temperature decreases. This tendency is illustrated in FIG. 6 and the sensitivity tends to decrease at −5° C., which is a low temperature, when the wavelength becomes longer.

In order to incorporate a GePD the sensitivity of which changes depending on the temperature and the wavelength into an optical communication system, a circuit that compensates for change in sensitivity is required, which increases a manufacturing cost. A means for solving this includes a means for controlling a voltage that is applied to a GePD according to the temperature and the wavelength (see, for example, Patent Literature 1 to 3).

FIG. 8 illustrates a first example in which a heater is incorporated in the GePD of the related art. In order to compensate for temperature dependence of the GePD, a heater may be incorporated as a temperature control means. In the first example, a heater 130 formed with a metal or a metal compound is incorporated in the upper clad layer 103 directly above the GePD.

FIG. 9 illustrates a second example in which a heater is incorporated in the GePD of the related art. In the second example, a part of the core layer 110 of the GePD is doped with impurities to prepare a resistor functioning as the heater 131.

In the case of the first example illustrated in FIG. 8, the heater 130 heats with highest thermal efficiency when the heater 130 is incorporated directly above the Ge layer 114. When a width of the Ge layer 114 is defined as a length in a horizontal direction of FIG. 8 and a width of the heater 130 is larger than the width of the Ge layer 114, the heater 130 overlaps the electrodes 116 and 118. Because the electrodes 116 and 118 are thermally conductive metals, heat escapes and the thermal efficiency applied to the Ge layer 114 is degraded.

FIG. 10 illustrates a relationship between an amount of heat generated by the heater and a germanium temperature. This is a relationship between an amount of heat generated by the heater and the germanium temperature when the width of the Ge layer 114 is 8 μm and the width of the heater 130 is 3 μm (500), 8 μm (501), 9 μm (503), and 35 μm (502) in the GePD 100. When the width of the heater 130 exceeds the width of the Ge layer 114, it can be seen that the thermal efficiency is degraded.

FIG. 11 illustrates a relationship between a heater width and the germanium temperature when the amount of heat generated by the heater is 40 mW. This is a relationship between the width of the heater 130 and the germanium temperature when the amount of heat generated by the heater is 40 mW. When the width of the heater is 9 μm, the germanium temperature is about 108° C., which is about 90% of the temperature when the width of the heater is 3 μm or 8 μm. Thus, it is preferable for the width of the heater 130 to be equal to or about 1 μm larger than the width of the Ge layer 114 at a maximum. Similarly, if a length of the Ge layer 114 is defined as a length in a horizontal direction (a direction of an optical axis) in FIG. 1, the thermal efficiency is also degraded when the length of the heater 130 becomes larger than the length of the Ge layer 114. Thus, it is also preferable for the length of the heater 130 to be equal to or about 1 μm larger than the length of the Ge layer 114 at a maximum.

As described above, when the heater 130 has a larger area than the Ge layer 114, the thermal efficiency is degraded. Typically, dimensions of the Ge layer 114 are about 1 to 10 μm in width and 10 to 50 μm in length in order for the above-described receiver to be operated at a communication speed. When the heater 130 having the same size as the Ge layer 114 is formed so that the thermal efficiency is not degraded, there is a problem that the heater 130 is vulnerable to electro-static discharge (ESD).

FIG. 12 illustrates a relationship between the length of the heater and the current density when 500 V is applied. Results when the width of the heater 130 in the GePD 100 is 3 μm (600), 8 μm (601), 16 μm (603), and 35 μm (602) are shown. A voltage of 500 V is a voltage that is typically required for an ESD withstand voltage in a human body model. Destruction is typically caused by ESD when the current density reaches 150 to 250 mA/μm$^2$, although the destruction also depends on a material or thickness of the heater. When the width of the heater 130 is 3 μm, the current density cannot fall below 150 to 250 mA/μm$^2$ or less and the ESD withstand voltage cannot be sufficient with the length of the heater 130 of 500 μm or less.

When the width of the heater 130 is 8 μm, the current density approaches 150 to 250 mA/μm$^2$ or less with the length of the heater 130 of 300 μm or more. Thus, it can be said that the heater width of 8 μm is a borderline on which the ESD withstand voltage can be secured. When the width of the heater 130 is 35 μm and 16 μm, the current density is 100 to 250 mA/μm$^2$ or less regardless of the length of the heater 130, and the ESD withstand voltage can be sufficient.

For example, when a size of the Ge layer 114 of the GePD 100 is about 1 to 10 μm in width and 10 to 50 μm in length, dimensions of the heater that efficiently applies heat are about 1 to 10 μm in width and 10 to 50 μm in length, but it can be seen from results of FIG. 12 that a sufficient ESD withstand voltage cannot be secured in this range of the dimensions.

Means for Solving the Problem

An object of the present invention is to provide a GePD having no temperature dependence of sensitivity in C and L bands by using a heater and to provide a photodetector having a sufficient ESD withstand voltage.

In order to achieve such an object, the present invention is characterized in that a photodetector according to an embodiment is a photodetector including a plurality of photodiodes including germanium or a germanium compound in a light absorption layer, and a plurality of heaters configured to apply heat to the light absorption layer of each of the plurality of photodiodes, in which the plurality of heaters are connected in series, the plurality of heaters are connected in parallel, or a plurality of sets of the plurality of heaters serially connected are connected in parallel.

Effects of the Invention

According to the present invention, because the plurality of heaters are connected in series or in parallel, the length of the heater can be regarded as a sum of lengths of the respective heaters, the width of the heater can be regarded as a sum of widths of the respective heaters, and the ESD withstand voltage determined by the width and length of the heater can be improved for the entire photodetector.

DESCRIPTION OF EMBODIMENTS

Hereinafter, embodiments of the present invention will be described in detail with reference to the drawings.

Figure 13:
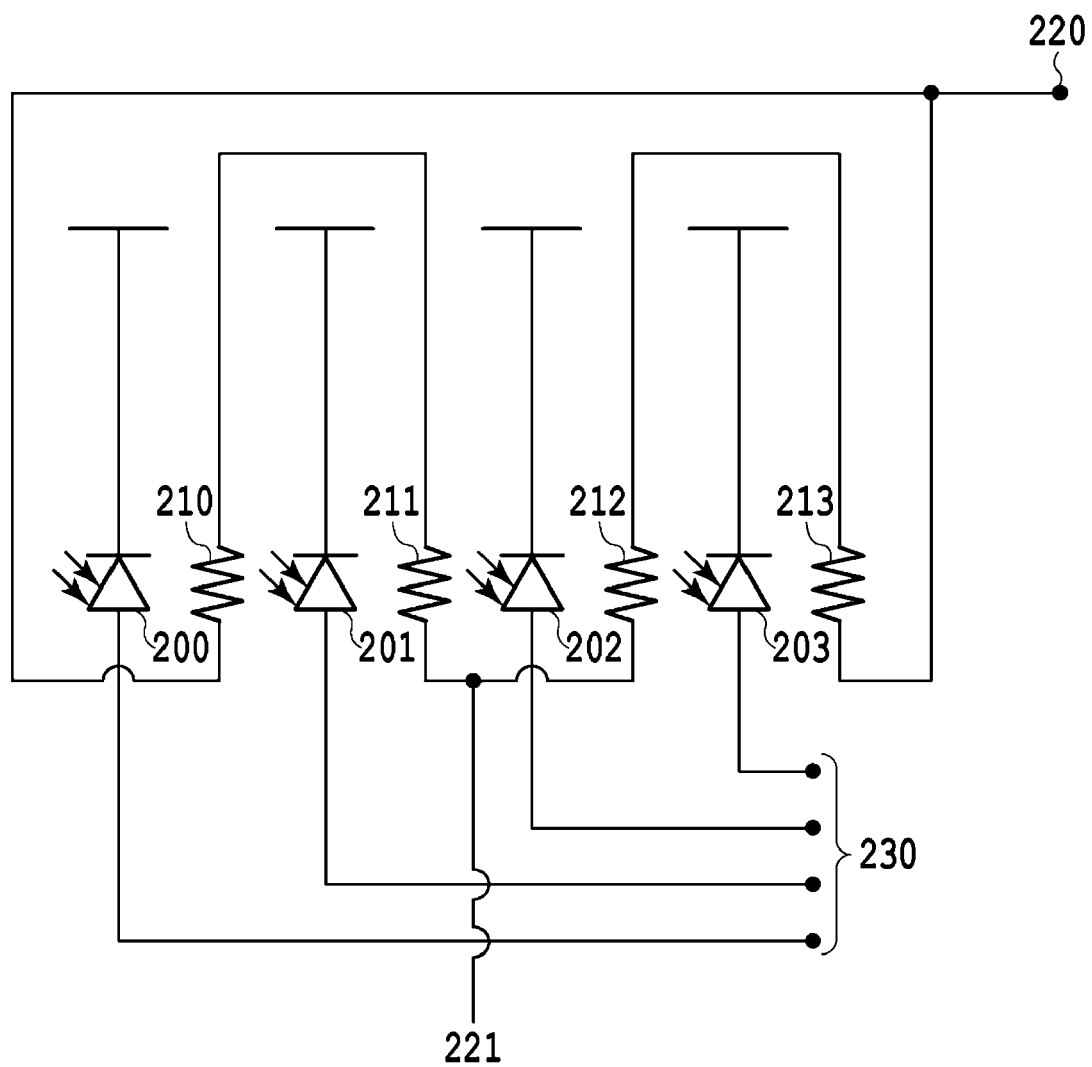
FIG. 13 is a diagram illustrating a photodetector according to an embodiment of the present invention.

FIG. 13 illustrates a photodetector according to an embodiment of the present invention. GePDs 200 to 203 include respective heaters 210 to 213, and the heaters 210 to 213 are connected in series and connected to power supplies 220 and 221. Here, the heaters 210 to 213 are divided into the heaters 210 and 211 and the heaters 212 and 213 and a plurality of sets of heaters connected in series are connected to the power supplies 220 and 221. Because the plurality of heaters are connected in series when viewed from the power supplies, a length of the heaters can be regarded as a sum of lengths of the respective heaters, and a width of the heaters can be regarded as a sum of widths of the respective heaters. Thus, even when the size of the heaters included in one GePD is substantially the same as a size of the Ge layer 114, an ESD withstand voltage determined by a width and length of the heater can be improved for the entire photodetector.

Example 1

Figure 1:
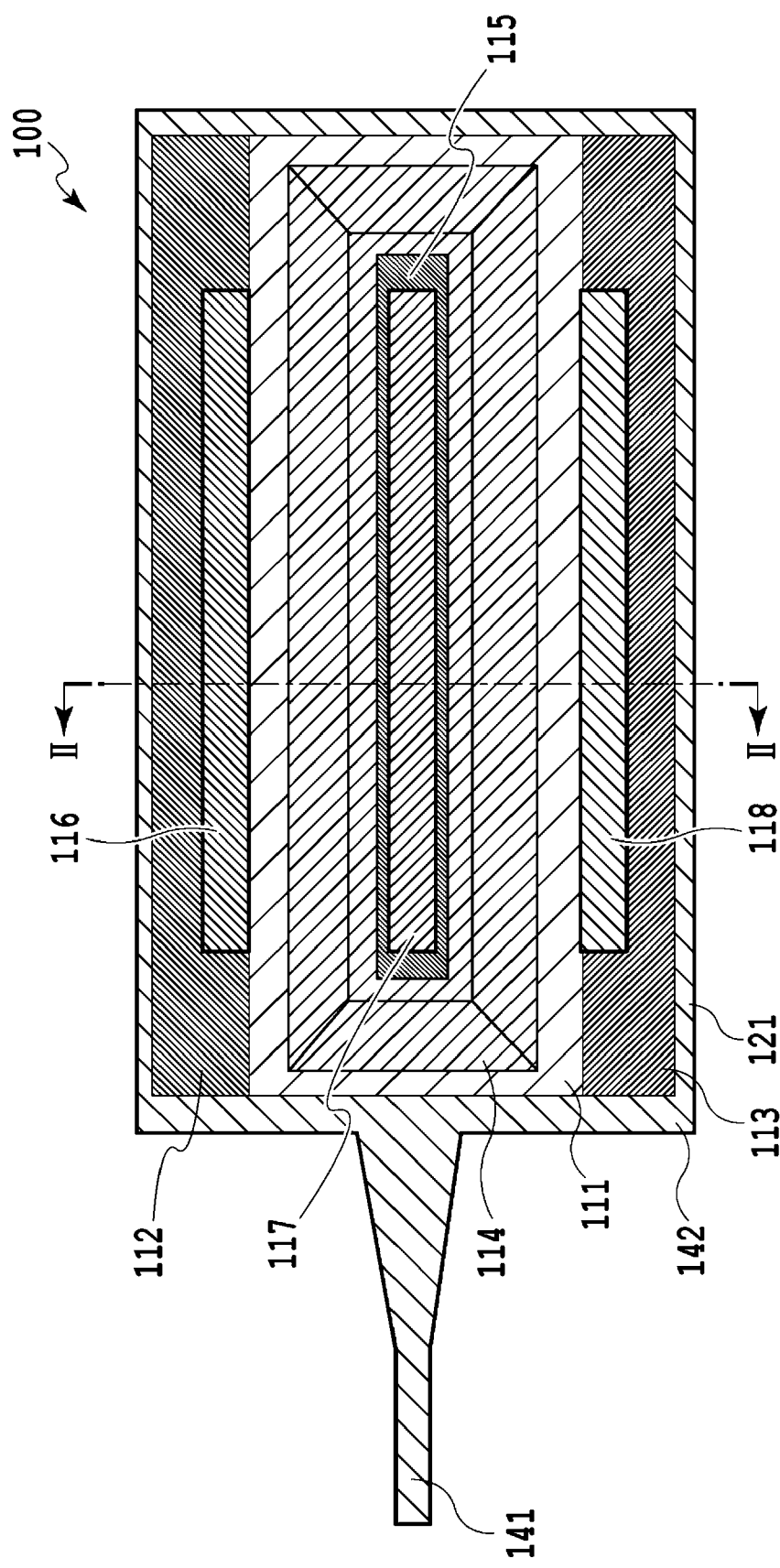
FIG. 1 is a diagram illustrating a structure of a waveguide-coupled vertical GePD of the related art.
Figure 2:
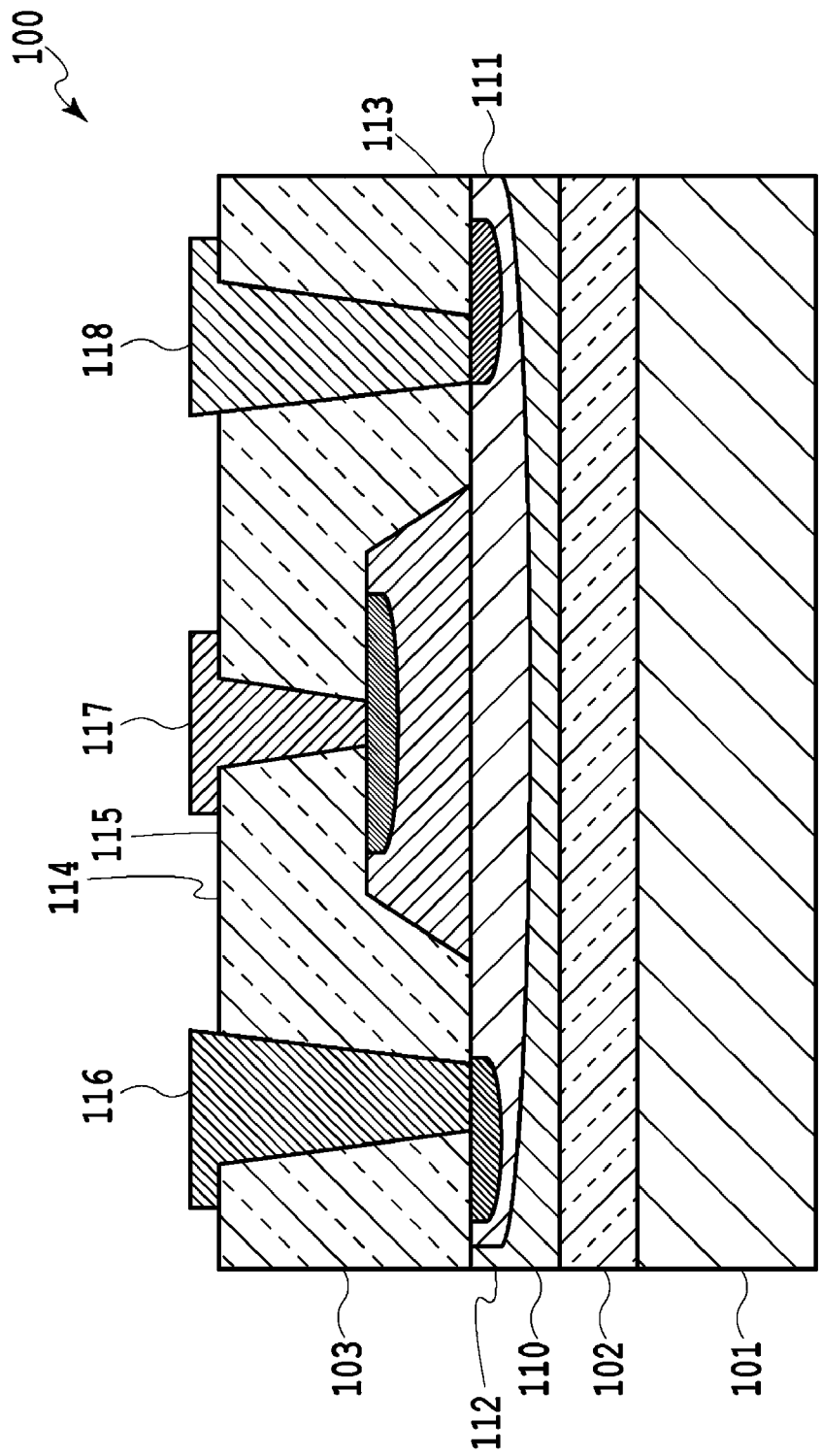
FIG. 2 is a cross-sectional view of the vertical GePD illustrated in FIG. 1.
Figure 3:
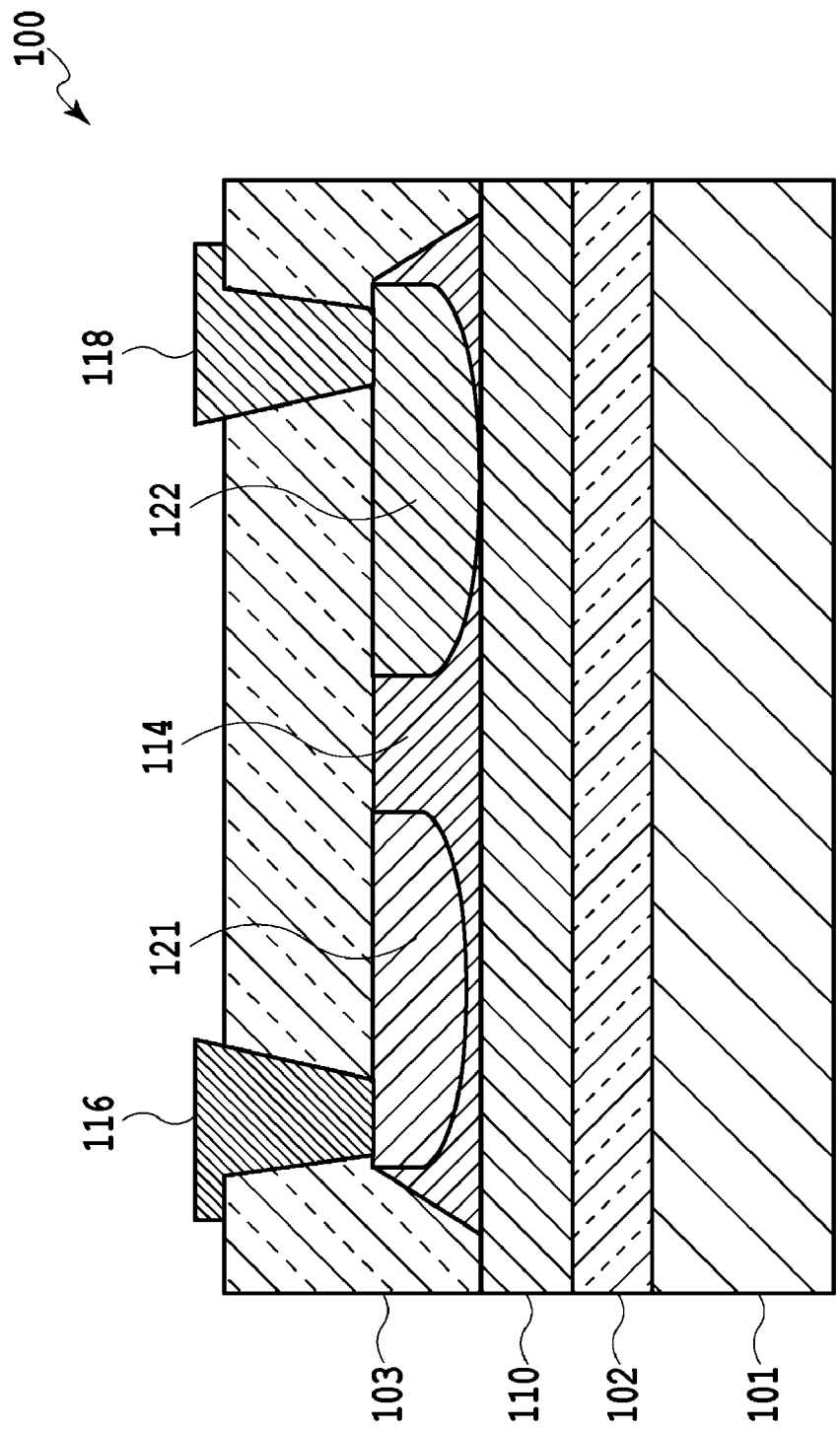
FIG. 3 is a diagram illustrating a first example of a waveguide-coupled horizontal GePD of the related art.
Figure 4:
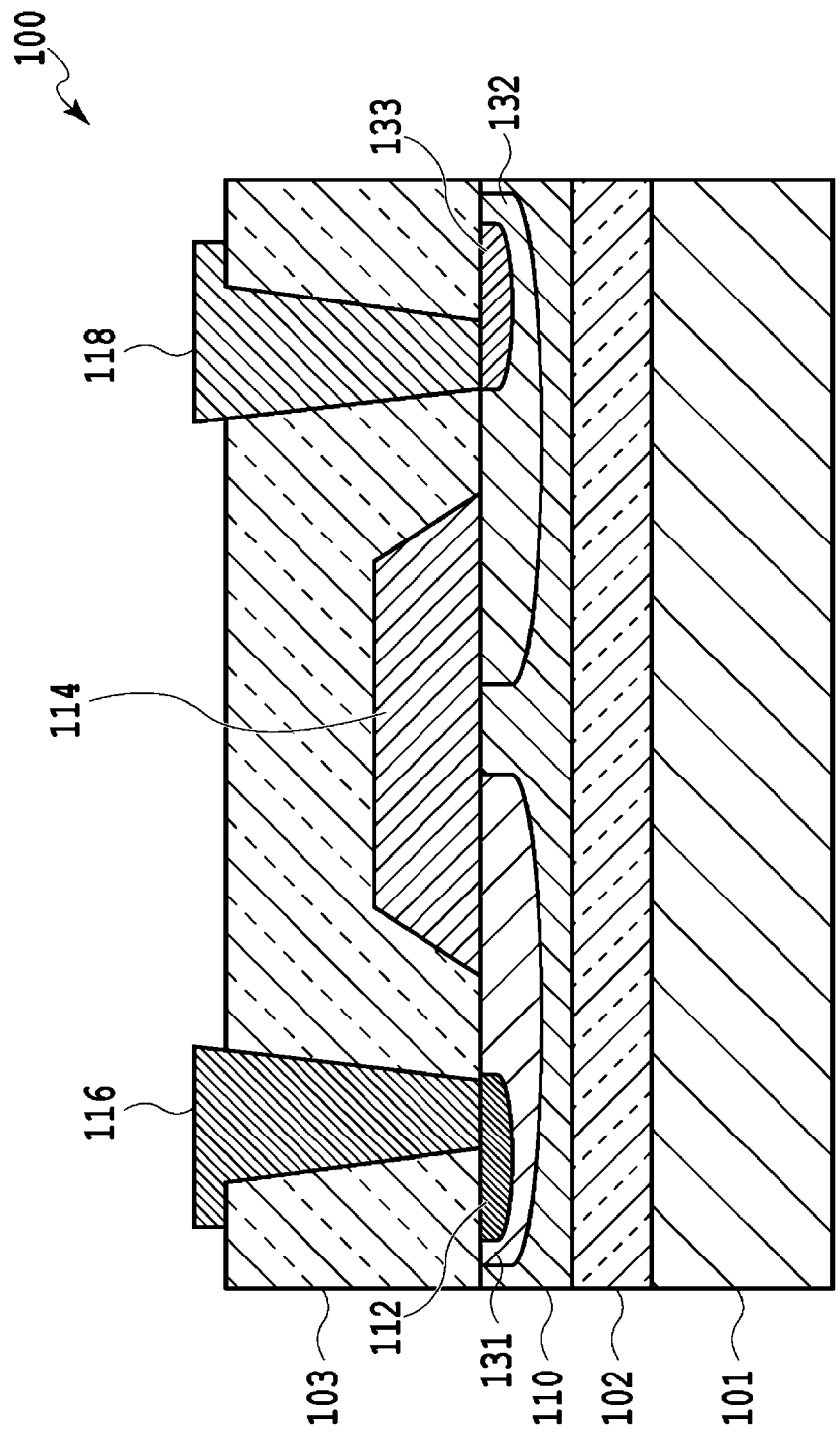
FIG. 4 is a diagram illustrating a second example of the waveguide-coupled horizontal GePD of the related art.
Figure 5:
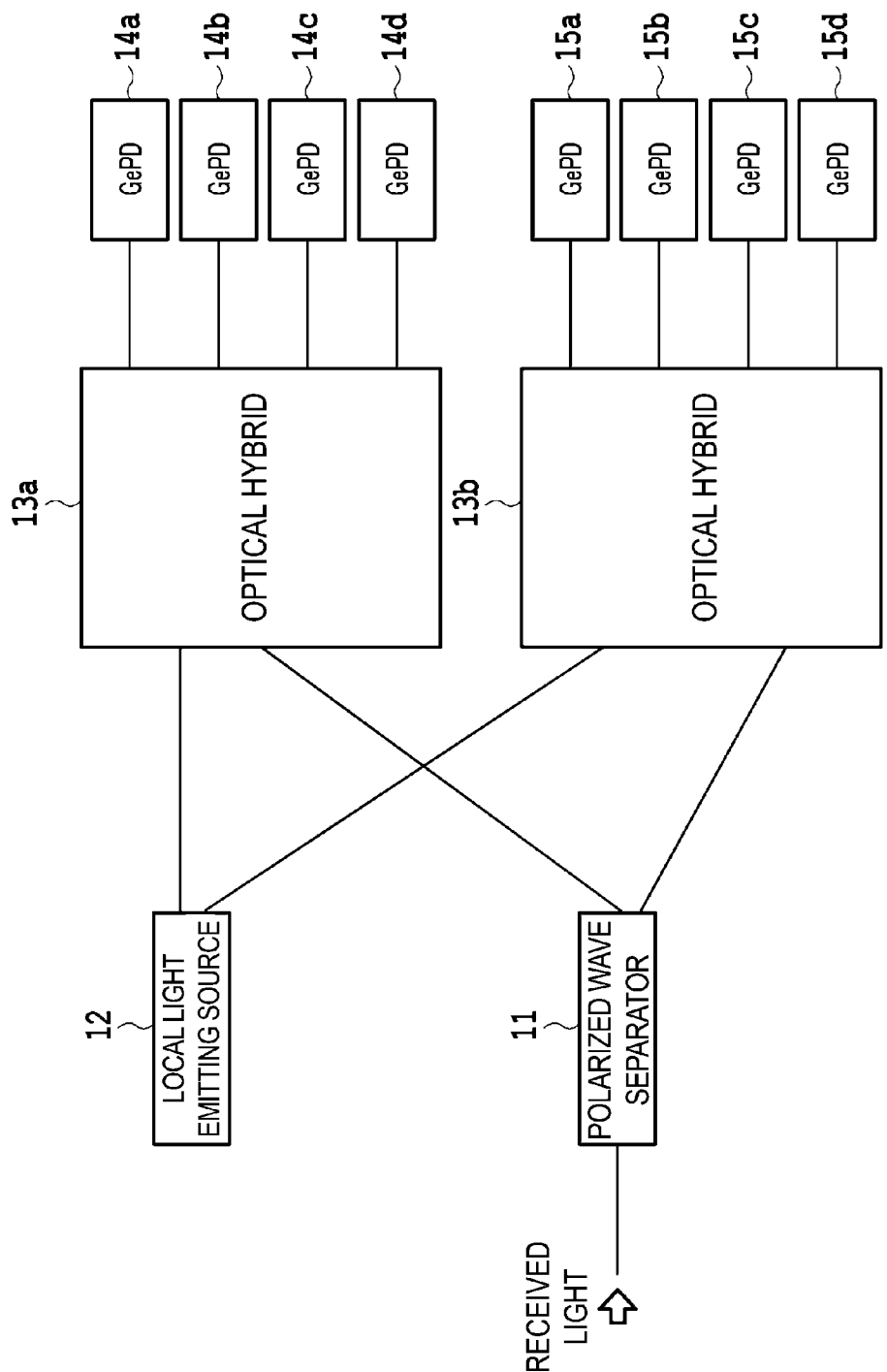
FIG. 5 is a diagram illustrating an example of a configuration of a receiver that is used in an optical digital coherent communication technology.
Figure 6:
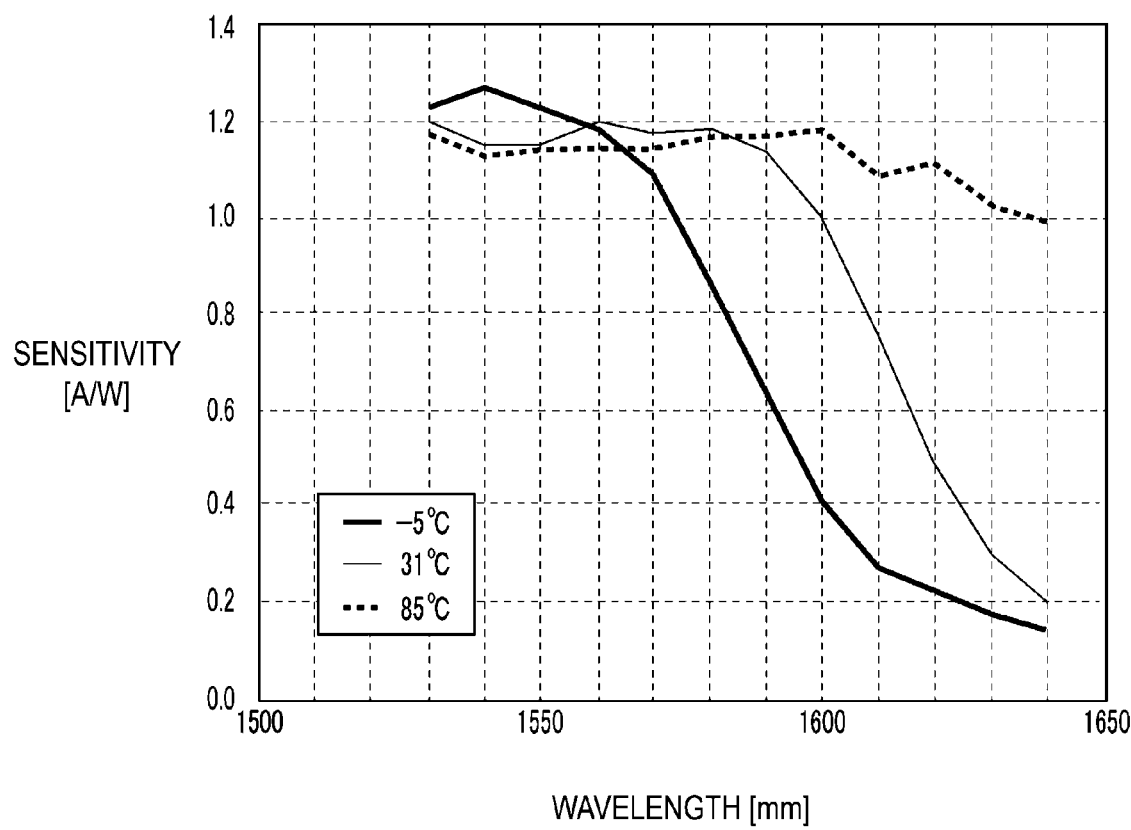
FIG. 6 is a diagram illustrating temperature and wavelength dependent characteristics of sensitivity of the GePD of the related art.
Figure 7:
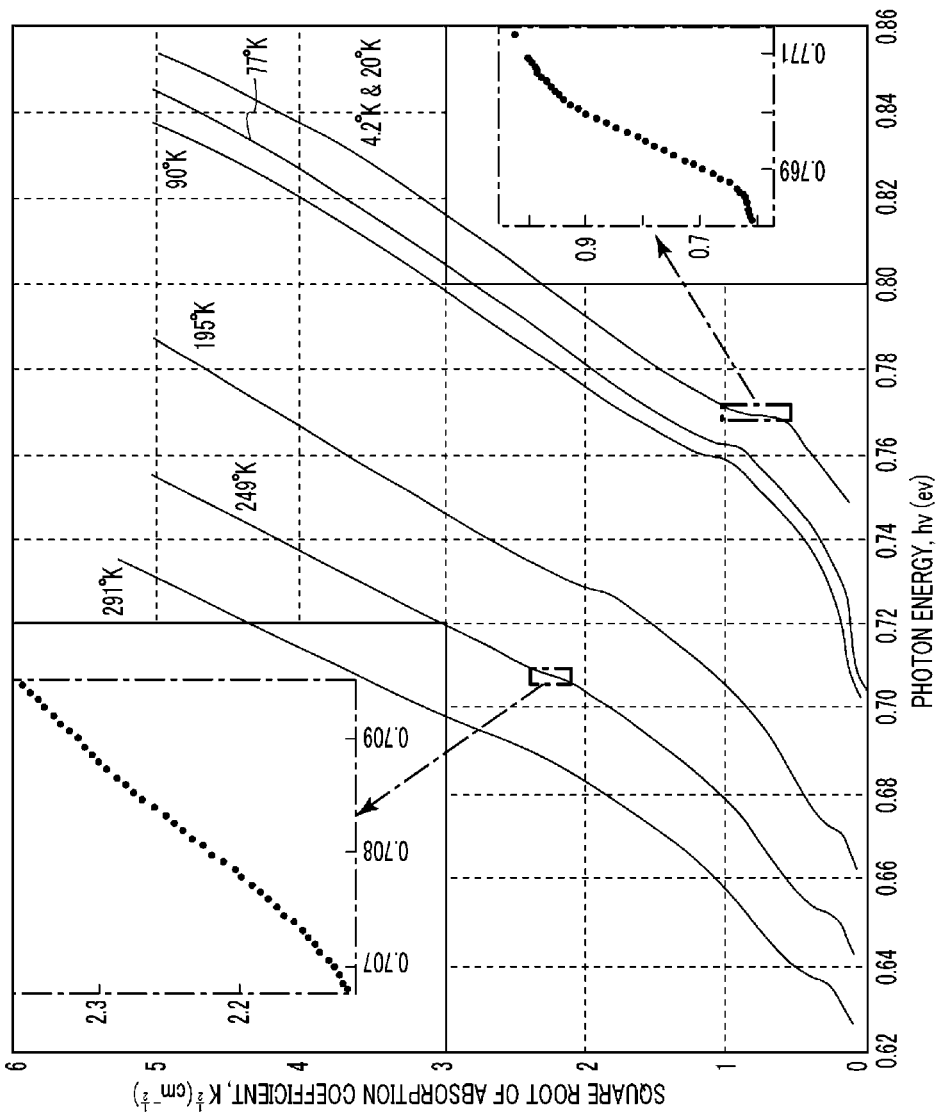
FIG. 7 is a diagram illustrating temperature dependent characteristics of a light absorption spectrum of Ge.
Figure 8:
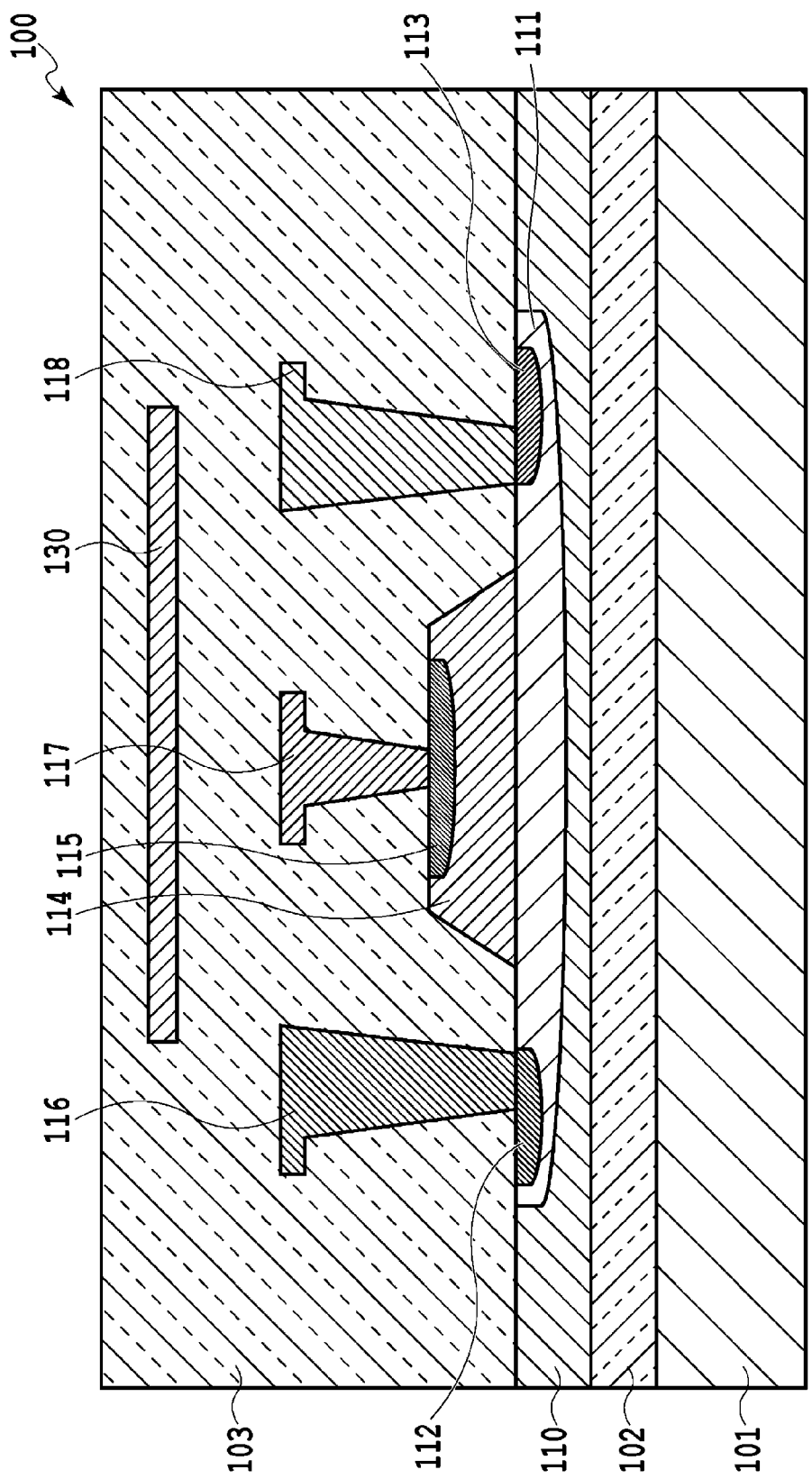
FIG. 8 is a diagram illustrating a first example in which a heater is incorporated in the GePD of the related art.
Figure 9:
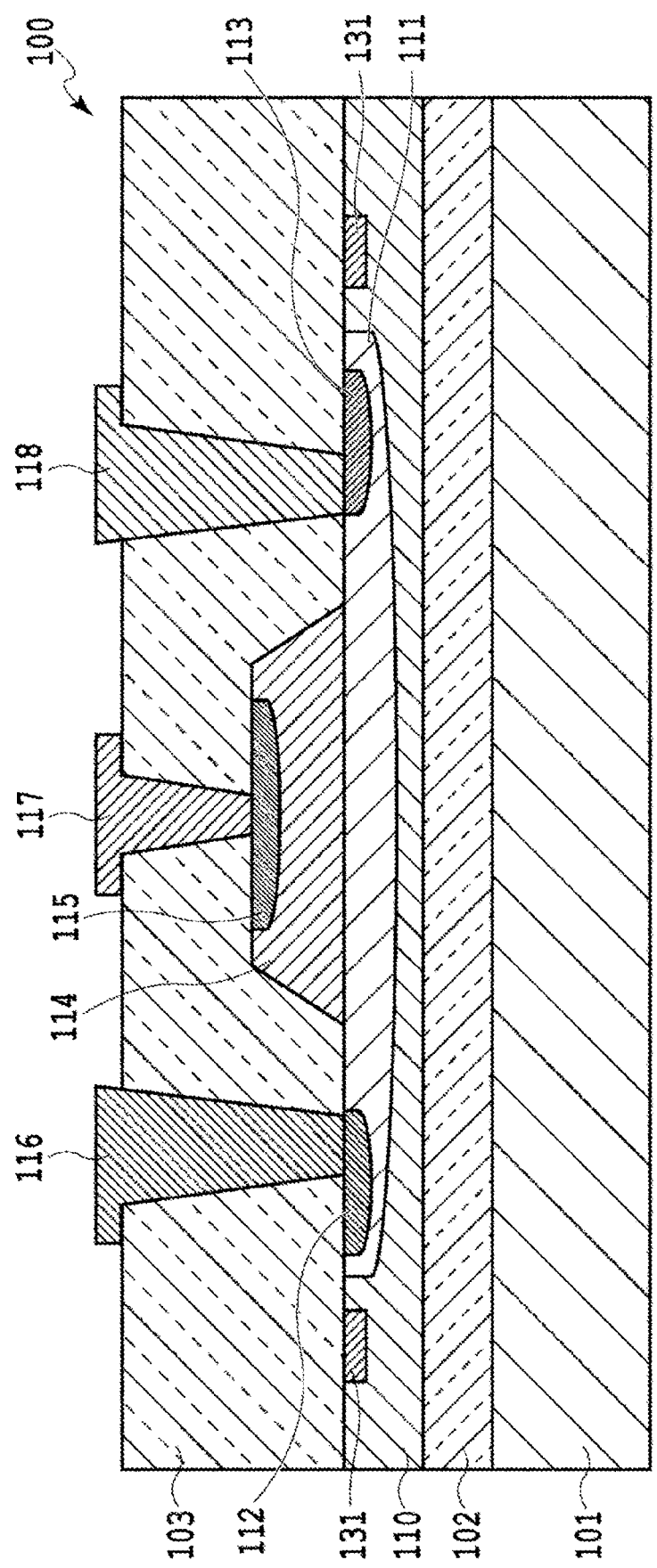
FIG. 9 is a diagram illustrating a second example in which a heater is incorporated in the GePD of the related art.
Figure 10:
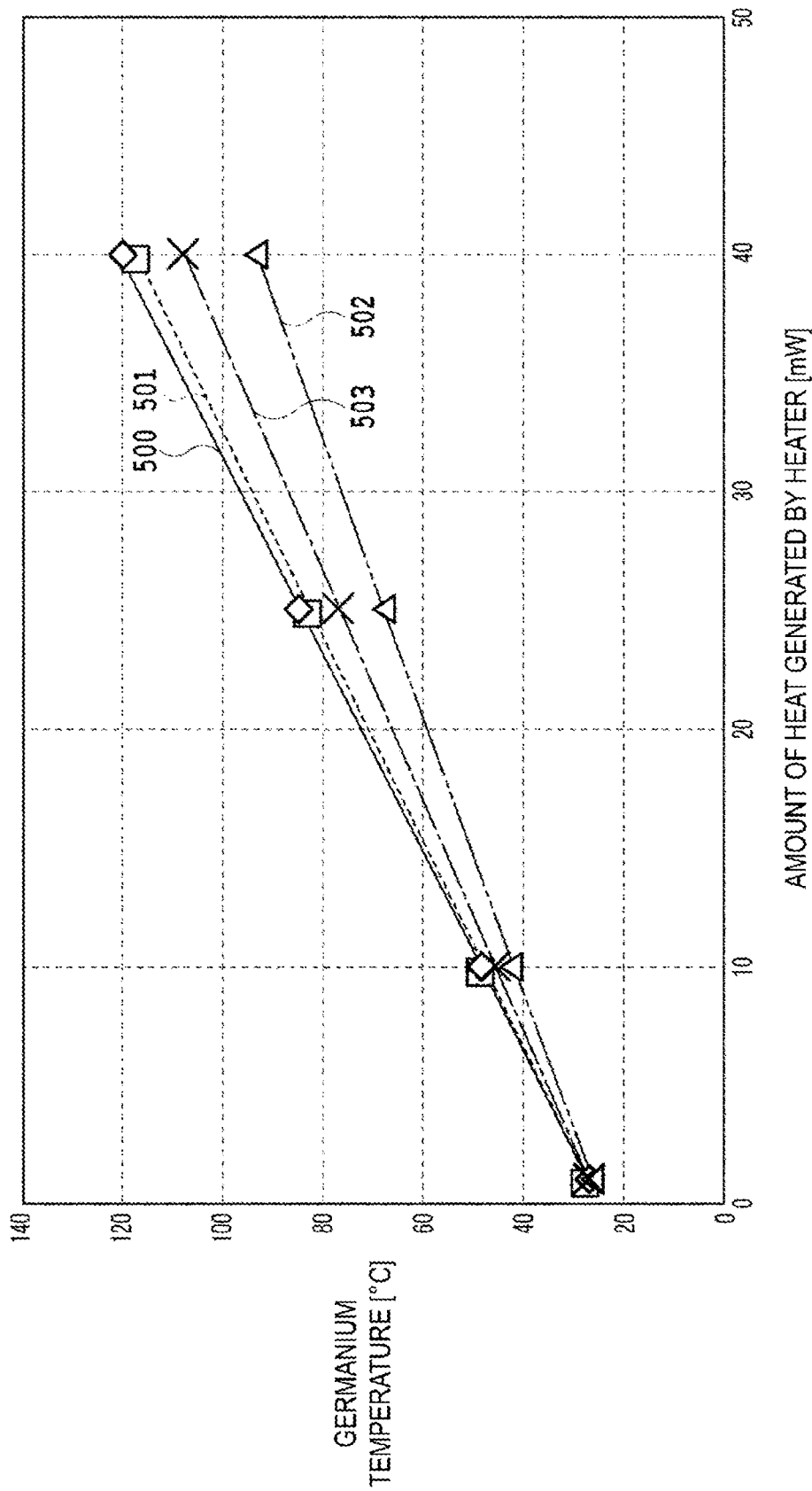
FIG. 10 is a diagram illustrating a relationship between an amount of heat generated by the heater and a germanium temperature.
Figure 11:
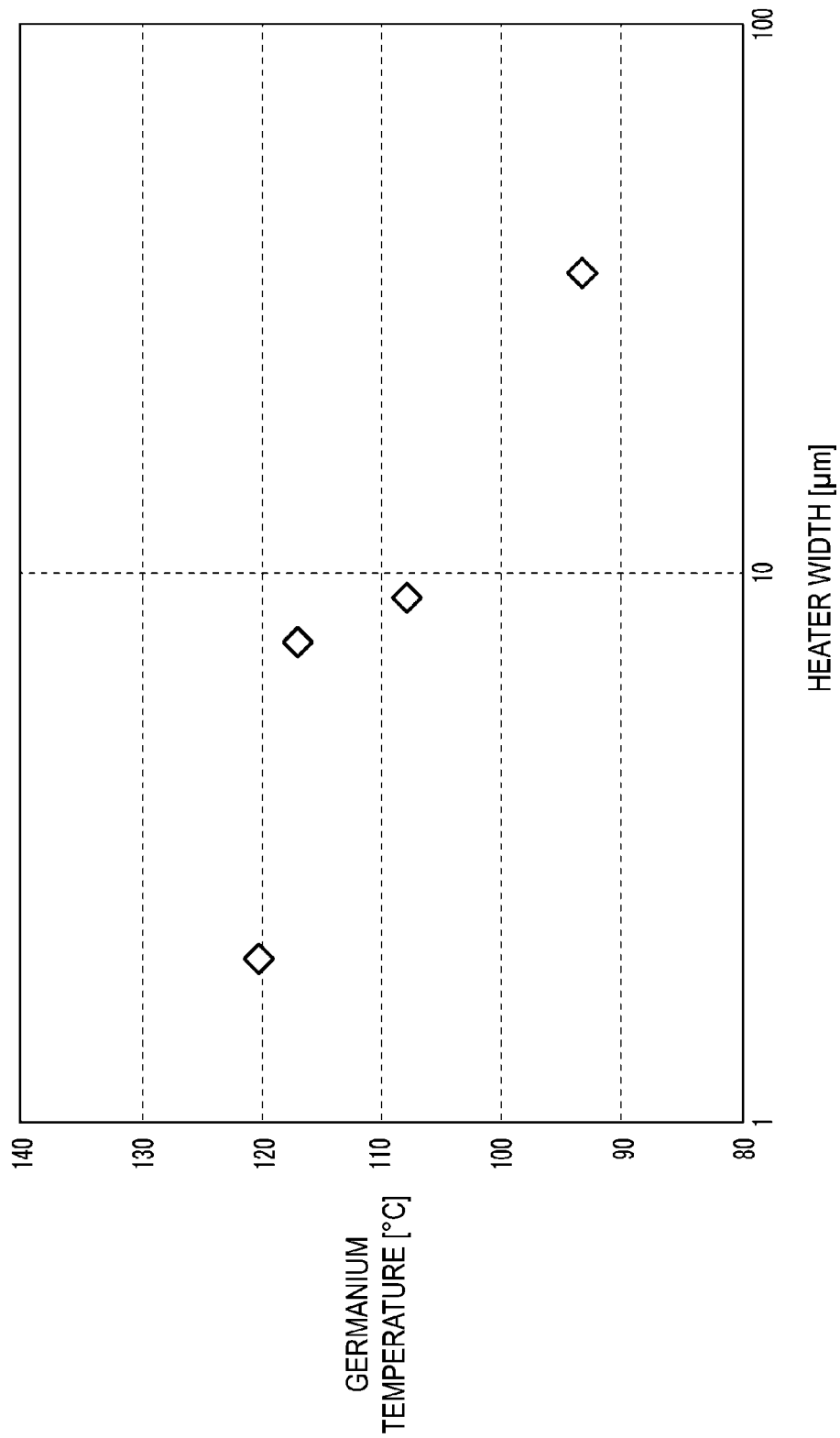
FIG. 11 is a diagram illustrating a relationship between a heater width and the germanium temperature when the amount of heat generated by the heater is 40 mW.
Figure 14:
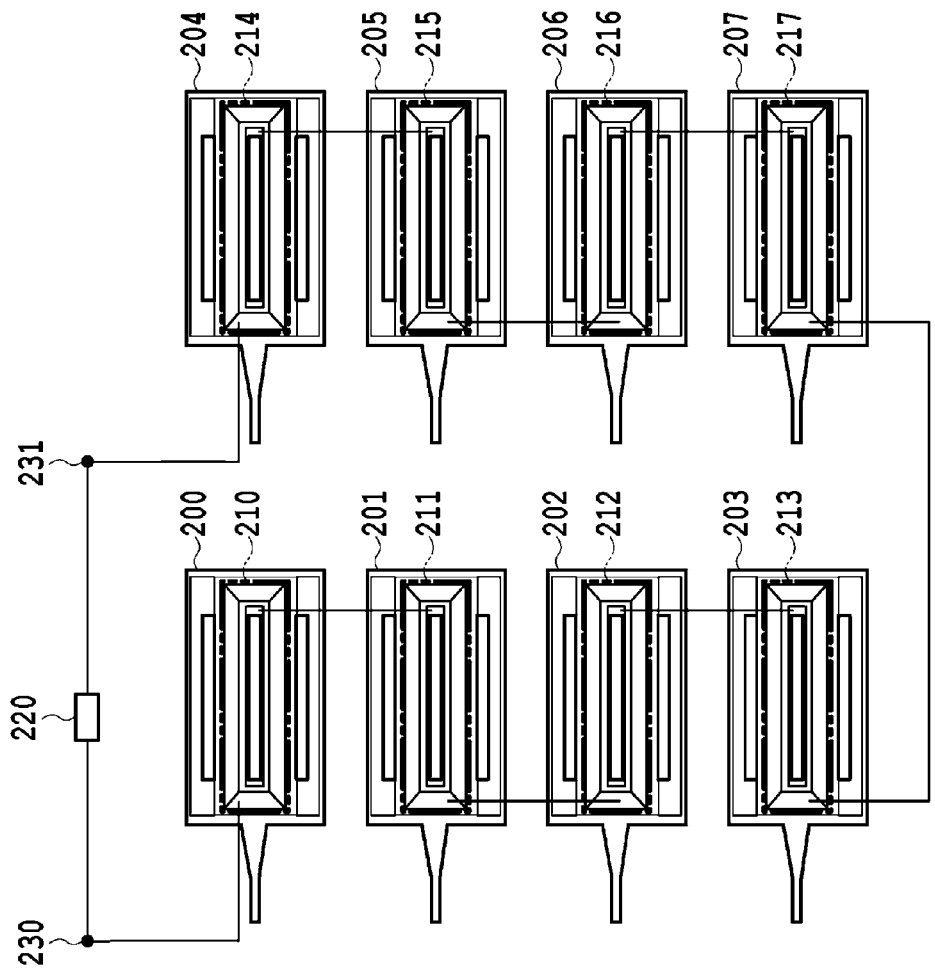
FIG. 14 is a diagram illustrating a photodetector according to Example 1 of the present invention.

FIG. 14 illustrates a photodetector according to Example 1 of the present invention. The GePDs 200 to 207 include respective heaters 210 to 217, and the heaters 210 to 217 are connected in series and connected to the power supply 220. The heaters 210 to 217 are formed with a metal or metal compound embedded in the upper clad layer 103, as illustrated in FIG. 8.

Figure 12:
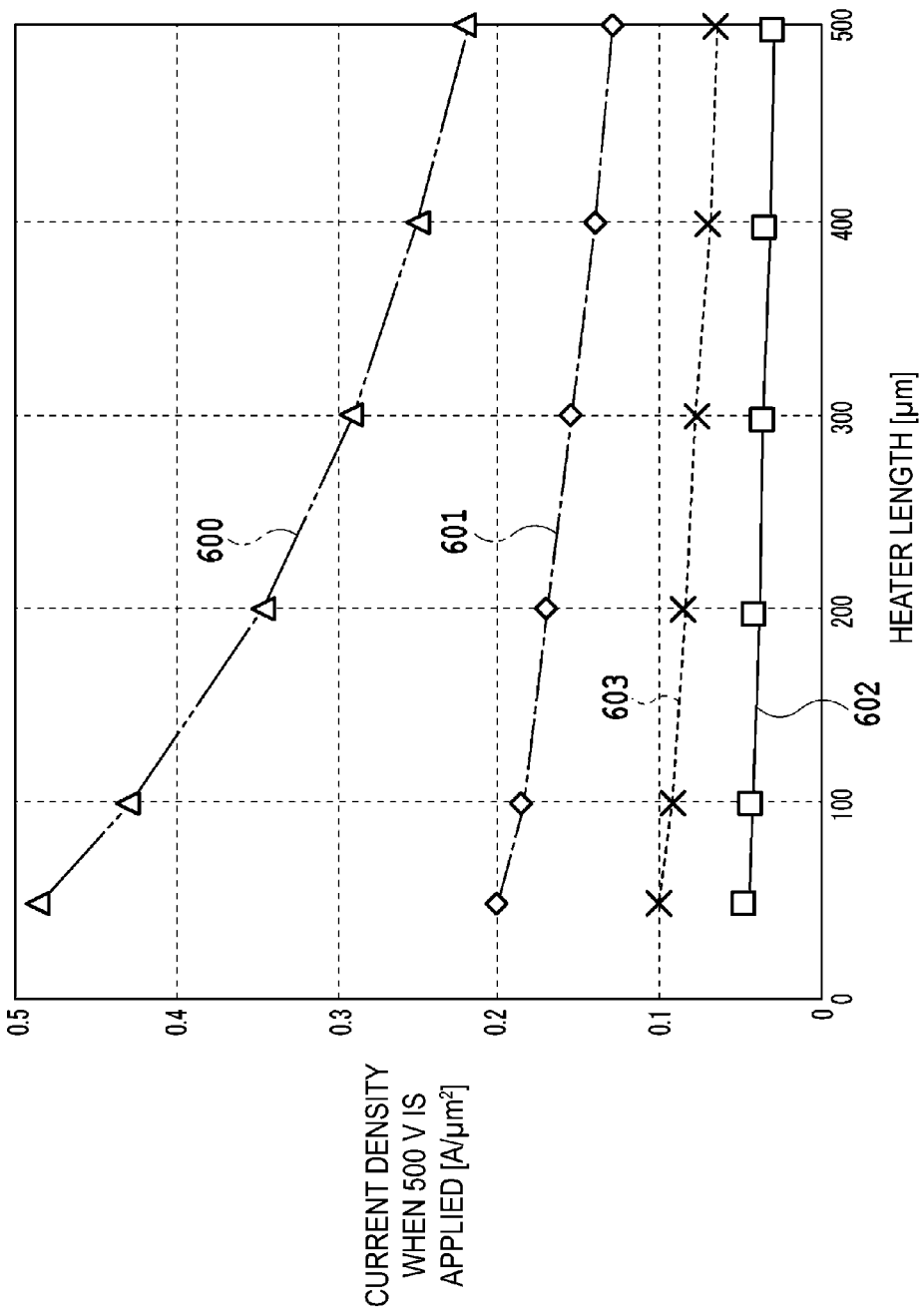
FIG. 12 is a diagram illustrating a relationship between a length of the heater and a current density when 500 V is applied.

It is preferable for a size of the heater to be substantially the same as the size of the Ge layer 114. Dimensions of the Ge layer 114 are about 1 to 10 μm in width and 10 to 50 μm in length, and are 10×50 μm in Example 1. Referring to FIG. 12, with one heater, a current density of 150 to 250 mA/μm² or less cannot be reached, but because a total length of the heater is 400 μm when eight heaters are connected in series, it is possible to satisfy the current density of 150 to 250 mA/μm² or less.

The heaters 210 to 217 connected in series are connected to the power supply 220 via terminals 230 and 231. These two terminals are only terminals on which the ESD load is applied, and the ESD load is distributed to the heaters provided in the eight GePDs. Thus, even when one heater is small, a sufficient ESD withstand voltage can be obtained in the entire photodetector.

Example 2

Figure 15:
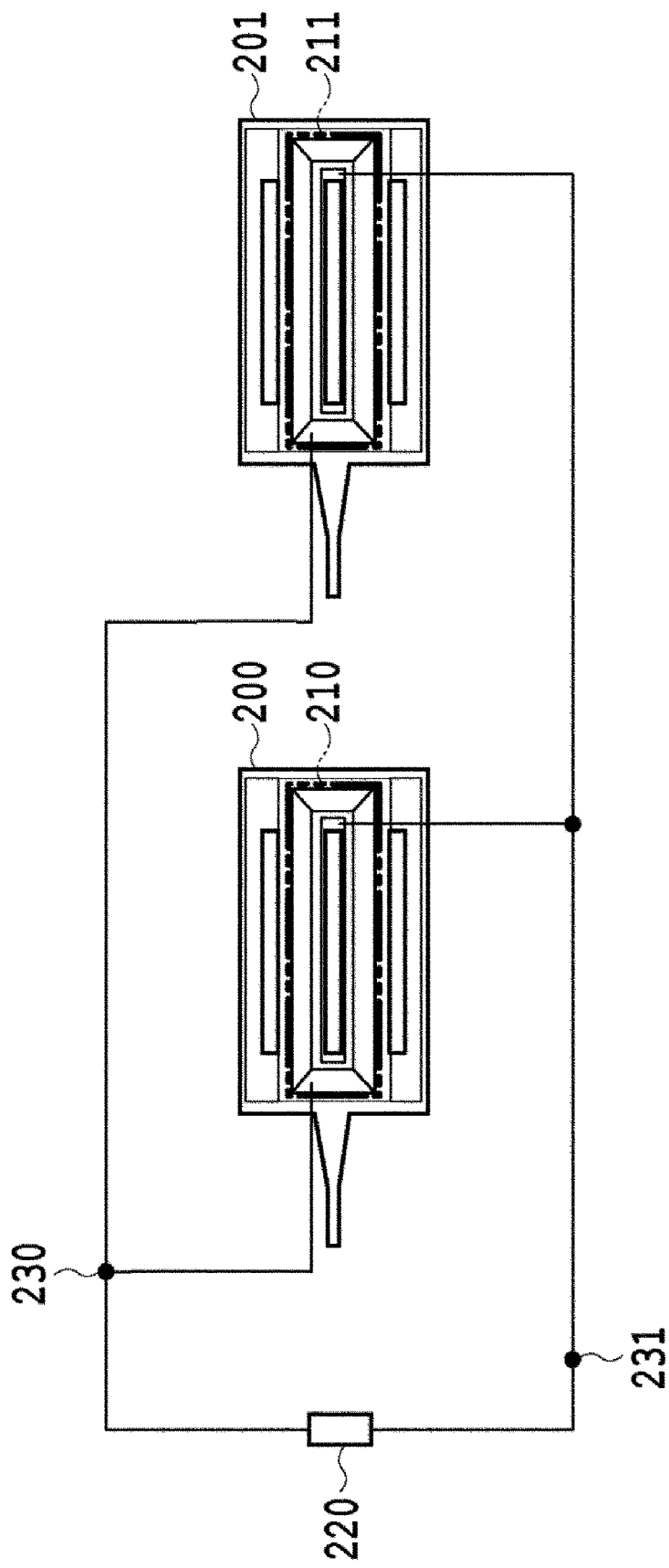
FIG. 15 is a diagram illustrating a photodetector according to Example 2 of the present invention.

FIG. 15 illustrates a photodetector according to Example 2 of the present invention. The GePDs 200 and 201 include respective heaters 210 and 211, and the heaters 210 and 211 are connected in parallel and connected to the power supply 220. The heaters 210 and 211 are formed with a metal or metal compound embedded in the upper clad layer 103, as illustrated in FIG. 8.

It is preferable for a size of the heater to be substantially the same as the size of the Ge layer 114. Dimensions of the Ge layer 114 are about 1 to 10 μm in width and 10 to 50 μm in length, and are 10×50 μm in Example 2. Referring to FIG. 12, with one heater, a current density of 150 to 250 mA/μm² or less cannot be reached, but because a total width of the heater is 20 μm when two heaters are connected in parallel, it is possible to satisfy the current density of 150 to 250 mA/μm² or less.

The heaters 210 and 211 connected in series are connected to the power supply 220 via the terminals 230 and 231. These two terminals are only terminals on which the ESD load is applied, and the ESD load is also distributed to the heaters provided in the two GePDs. Thus, even when one heater is small, a sufficient ESD withstand voltage can be obtained in the entire photodetector.

Example 3

Figure 16:
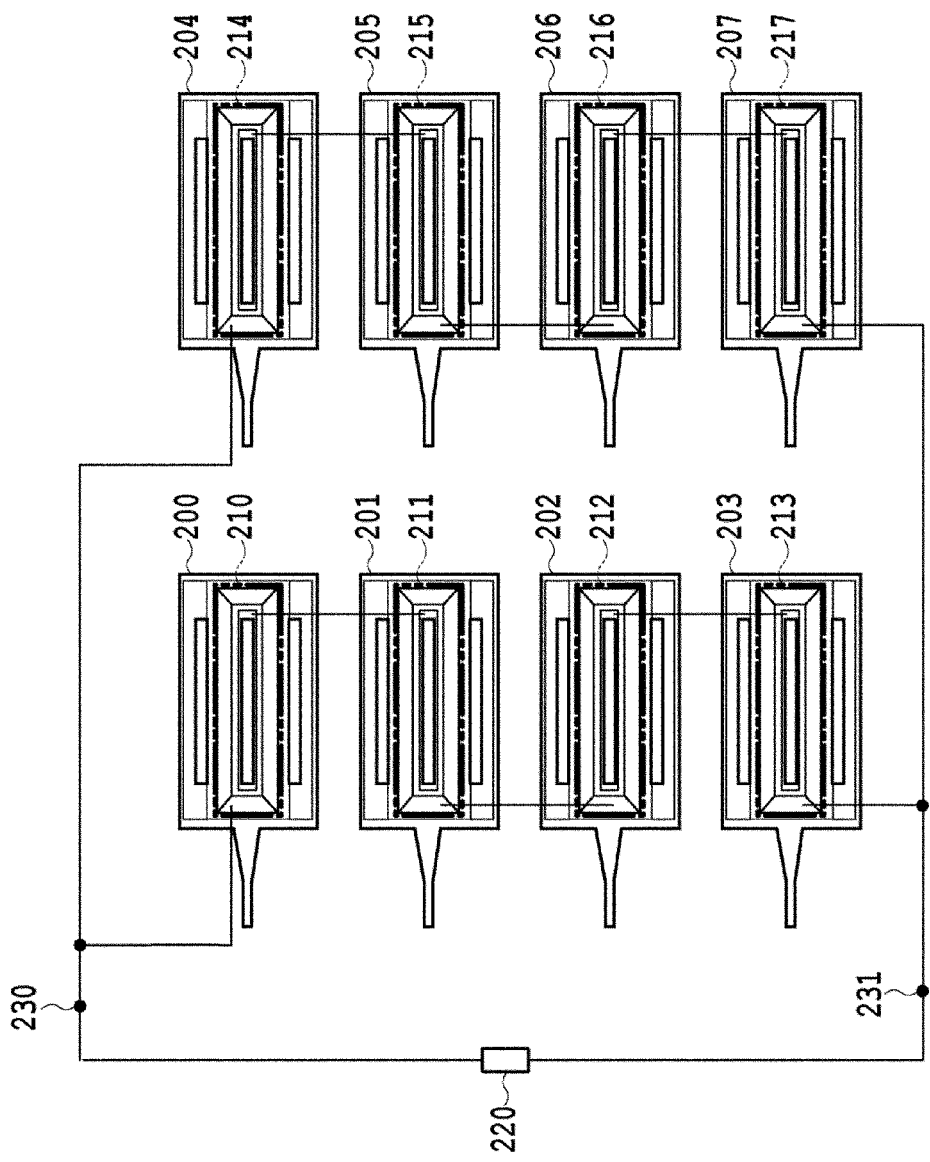
FIG. 16 is a diagram illustrating a photodetector according to Example 3 of the present invention.

FIG. 16 illustrates a photodetector according to Example 3 of the present invention. The GePDs 200 to 207 include respective heaters 210 to 217, the heaters 210 to 213 and the heaters 214 to 217 are connected in series, and two sets of heaters are connected in parallel to the power supply 220. The heaters 210 to 217 are formed with a metal or metal compound embedded in the upper clad layer 103, as illustrated in FIG. 8.

It is preferable for a size of the heater to be substantially the same as the size of the Ge layer 114. Dimensions of the Ge layer 114 are about 1 to 10 μm in width and 10 to 50 μm in length, and are 10×50 μm in Example 2. Referring to FIG. 12, with one heater, a current density of 150 to 250 mA/μm² or less cannot be reached, but because a total width of the heater is 20 μm and a total length of the heater is 200 μm when two heaters are connected in parallel, it is possible to satisfy the current density of 150 to 250 mA/μm² or less.

The heaters 210 to 213 and the heaters 214 to 217 connected in series are connected to the power supply 220 via terminals 230 and 231. These two terminals are only terminals on which the ESD load is applied, and the ESD load is also distributed to the heaters provided in the two GePDs. Thus, even when one heater is small, a sufficient ESD withstand voltage can be obtained in the entire photodetector. Further, because it is possible to increase a resistance value due to an increase in series resistance of each set of heaters, it is possible to apply the same heat with a small voltage, as compared with Example 2.

Example 4

Figure 17:
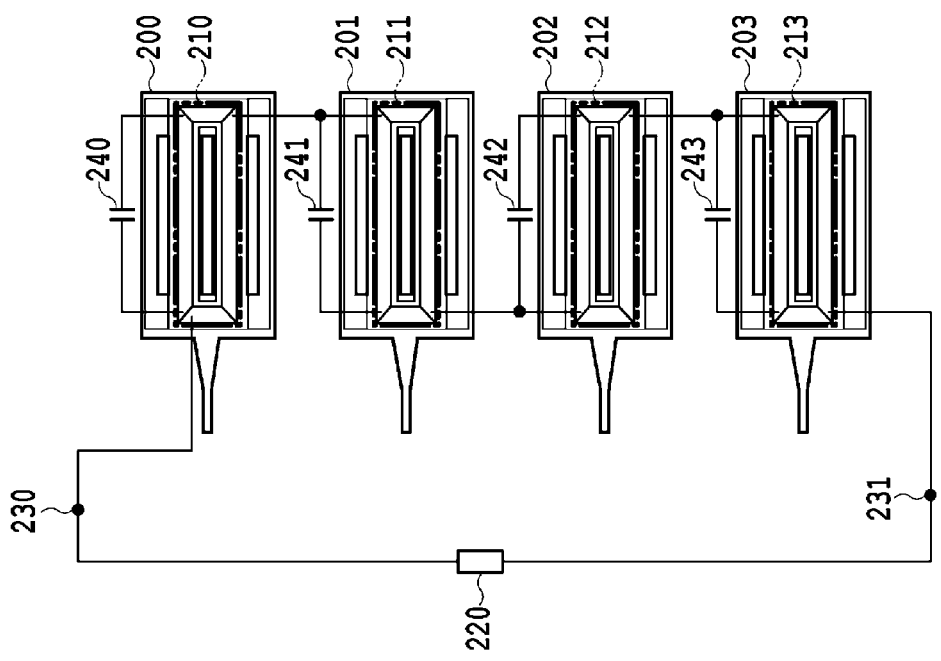
FIG. 17 is a diagram illustrating a photodetector according to Example 4 of the present invention.

FIG. 17 illustrates a photodetector according to Example 4 of the present invention. The GePDs 200 to 203 include respective heaters 210 to 213, and the heaters 210 to 213 are connected in series and connected to the power supply 220. Further, capacitors 240 to 243 are connected in parallel to the heaters 210 to 213, respectively. The heaters 210 to 213 are formed with a metal or metal compound embedded in the upper clad layer 103, as illustrated in FIG. 8.

It is preferable for a size of the heater to be substantially the same as the size of the Ge layer 114. Dimensions of the Ge layer 114 are about 1 to 10 μm in width and 10 to 50 μm in length, and are 10×50 μm in Example 4. Referring to FIG. 12, with one heater, a current density of 150 to 250 mA/μm$^2$ or less cannot be reached, but because a total length of the heater is 200 μm when four heaters are connected in series and the capacitors 240 to 243 are connected in parallel, it is possible to satisfy the current density of 150 to 250 mA/μm$^2$ or less. This is because it is possible to distribute an ESD load due to the capacitor, in addition to a serial connection of the heaters.

The heaters 210 to 213 connected in series are connected to the power supply 220 via terminals 230 and 231. These two terminals are only terminals on which the ESD load is applied, and the ESD load is distributed to the heaters provided in the eight GePDs. Thus, even when one heater is small, a sufficient ESD withstand voltage can be obtained in the entire photodetector. The configuration of Example 4 is useful in a case in which the current density cannot be sufficiently reduced even when a small number of heaters are connected in parallel or in series.

REFERENCE SIGNS LIST 100, 200 to 207 GePD
101 Si substrate
102 Lower clad layer
103 Upper clad layer
110 Core layer
111 p-type Si slab
112, 113, 133 Silicon electrode portion
114 Ge layer
115 Ge region
116 to 118 Electrode
121, 122 Germanium region
130, 210 to 217 Heater
131, 132 Silicon region
141 Waveguide layer
142 Silicon Slab
220, 221 Power supply
230, 231 Terminal
240 to 243 Capacitor

The invention claimed is:

1. A photodetector comprising:
a plurality of photodiodes including germanium or a germanium compound in a light absorption layer; and
a plurality of heaters configured to apply heat to the light absorption layer of each of the plurality of photodiodes, wherein each of the plurality of photodiodes is associated with one of the plurality of heaters,
wherein the plurality of heaters are connected in series, the plurality of heaters are connected in parallel, or a plurality of sets of the plurality of heaters serially connected are connected in parallel, wherein a collective width of the plurality of heaters when the plurality of heaters are connected in parallel and a collective length of the plurality of heaters are connected in series are configured to provide the photodetector with a sufficient electrostatic discharge withstand voltage.

2. The photodetector according to claim 1, wherein a photodiode of the plurality of photodiodes includes:
a silicon substrate;
a lower clad layer formed on the silicon substrate;
a core layer formed on the lower clad layer and including a silicon slab doped with impurity ions having a first conductivity type, an electrode portion doped with the impurity ions having the first conductivity type at a high concentration, and a waveguide layer connected to the silicon slab;
a germanium layer formed on the core layer and including a germanium region doped with impurities having a second conductivity type;
an upper clad layer formed on the core layer and the germanium layer; and
electrodes connected to the electrode portion and the germanium region, respectively.

3. The photodetector according to claim 1, wherein a photodiode of the plurality of photodiodes includes:
a silicon substrate;
a lower clad layer formed on the silicon substrate;
a core layer formed on the lower clad layer and including a silicon slab doped with impurity ions having a first conductivity type, and a waveguide layer connected to the silicon slab;
a germanium layer formed on the core layer and including a first germanium region doped with the impurity ions having the first conductivity type and a second germanium region doped with impurity ions having a second conductivity type;
an upper clad layer formed on the core layer and the germanium layer; and
electrodes connected to the first germanium region and the second germanium region, respectively.

4. The photodetector according to claim 1, wherein a photodiode of the plurality of photodiodes includes:
a silicon substrate;
a lower clad layer formed on the silicon substrate;
a core layer formed on the lower clad layer and including a silicon slab, the silicon slab including a first silicon region doped with impurity ions having a first conductivity type, a first electrode portion doped with the impurity ions having the first conductivity type, a second silicon region doped with impurity ions having a second conductivity type, and a second electrode portion doped with the impurity ions having the second conductivity type, and a waveguide layer connected to the silicon slab;
a germanium layer formed on the core layer;
an upper clad layer formed on the core layer and the germanium layer; and
electrodes connected to the first electrode portion and the second electrode portion.

5. The photodetector according to claim 2,
wherein a heater of the plurality of heaters is formed with a metal or metal compound embedded in the upper clad layer and the heater of the plurality of heaters is disposed directly above the light absorption layer, and
a width and a length of the heater are equal to or 1 μm larger than a width and a length of the light absorption layer, respectively.

6. The photodetector according to claim 2, wherein a heater of the plurality of heaters is prepared by doping the core layer with impurities and wherein the heater is disposed around the light absorption layer.

7. The photodetector according to claim 5, wherein a density of a current flowing through each of the plurality of heaters is 150 to 250 mA/μm² or less.

8. The photodetector according to claim 5, further comprising a capacitor connected in parallel with the heater.

9. The photodetector according to claim 3,
wherein a heater of the plurality of heaters is formed with a metal or metal compound embedded in the upper clad layer and wherein the heater is disposed directly above the light absorption layer, and
a width and a length of the heater are equal to or 1 μm larger than a width and a length of the light absorption layer, respectively.

10. The photodetector according to claim 4,
wherein a heater of the plurality of heaters is formed with a metal or metal compound embedded in the upper clad layer and wherein the heater is disposed directly above the light absorption layer, and
a width and a length of the heater are equal to or 1 μm larger than a width and a length of the light absorption layer, respectively.

11. The photodetector according to claim 3, wherein a heater of the plurality of heaters is prepared by doping the core layer with impurities and wherein the heater is disposed around the light absorption layer.

12. The photodetector according to claim 4, wherein a heater of the plus of heaters is prepared by doping the core layer with impurities and wherein the heater is disposed around the light absorption layer.

13. The photodetector according to claim 6, wherein a density of a current flowing through each of the plurality of heaters is 150 to 250 mA/μm² or less.

14. The photodetector according to claim 6, further comprising a capacitor connected in parallel with the heater.

\* \* \* \* \*